(12) United States Patent
Jang

(10) Patent No.: US 7,067,908 B2
(45) Date of Patent: Jun. 27, 2006

(54) SEMICONDUCTOR PACKAGE HAVING IMPROVED ADHESIVENESS AND GROUND BONDING

(75) Inventor: Sung Sik Jang, Hanam-shi (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/868,643

(22) Filed: Jun. 15, 2004

(65) Prior Publication Data

US 2004/0227217 A1    Nov. 18, 2004

Related U.S. Application Data

(63) Continuation of application No. 09/687,493, filed on Oct. 13, 2000, now Pat. No. 6,853,059.

(30) Foreign Application Priority Data

Oct. 15, 1999    (KR) .................................. 99-44653

(51) Int. Cl.
| | | |
|---|---|---|
| H01L 23/48 | (2006.01) | |
| H01L 29/40 | (2006.01) | |
| H01L 23/495 | (2006.01) | |
| H01L 23/52 | (2006.01) | |

(52) U.S. Cl. .............................. 257/684; 257/E23.001; 257/E23.031; 257/E23.05; 257/E23.061; 257/696; 257/698; 257/796; 257/666; 257/712; 257/713; 257/717; 257/707; 257/711; 257/786; 257/784

(58) Field of Classification Search ................. 257/684, 257/666, 696, 698, 796, 675, 712, 713, 707, 257/711, 730, 788, 787, 784, 786, E23.011, 257/E23.031, E23.05, E23.061
See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,258,381 | A | 3/1981 | Inaba |
| 4,289,922 | A | 9/1981 | Devlin |
| 4,301,464 | A | 11/1981 | Otsuki et al. |
| 4,332,537 | A | 6/1982 | Slepcevic |
| 4,417,266 | A | 11/1983 | Grabbe |
| 4,451,224 | A | 5/1984 | Harding |
| 4,530,152 | A | 7/1985 | Roche et al. |
| 4,541,003 | A | 9/1985 | Otsuka et al. |

(Continued)

FOREIGN PATENT DOCUMENTS

EP    5421117    6/1979

(Continued)

*Primary Examiner*—Alexander Oscar Williams
(74) *Attorney, Agent, or Firm*—Stetina Brunda Garred & Brucker

(57) ABSTRACT

A semiconductor package having improved adhesiveness between the chip paddle and the package body and having improved ground-bonding of the chip paddle. A plurality of through-holes are formed in the chip paddle for increasing the bonding strength of encapsulation material in the package body. A plurality of tabs are formed in the chip paddle may also be used alone or in conjunction with the through-holes to further increase the bonding strength of the encapsulation material in the package body. The tabs provide additional area for the bonding site to ground wires from the semiconductor chip by increasing the length of the chip paddle.

11 Claims, 4 Drawing Sheets

U.S. PATENT DOCUMENTS

| | | |
|---|---|---|
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, III et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A * | 1/1995 | Lerner et al. ............... 257/712 |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |

| | | | | | | |
|---|---|---|---|---|---|---|
| 5,917,242 | A | 6/1999 | Ball | 6,559,525 | B1 | 5/2003 | Huang |
| 5,939,779 | A | 8/1999 | Kim | 6,566,168 | B1 | 5/2003 | Gang |
| 5,942,794 | A | 8/1999 | Okumura et al. | 6,583,503 | B1 | 6/2003 | Akram et al. |
| 5,951,305 | A | 9/1999 | Haba | 6,603,196 | B1 | 8/2003 | Lee et al. |
| 5,959,356 | A | 9/1999 | Oh | 6,624,005 | B1 | 9/2003 | DiCaprio et al. |
| 5,969,426 | A | 10/1999 | Baba et al. | 6,667,546 | B1 | 12/2003 | Huang et al. |
| 5,973,388 | A | 10/1999 | Chew et al. | 2001/0008305 | A1 | 7/2001 | McLellan et al. |
| 5,976,912 | A | 11/1999 | Fukutomi et al. | 2001/0011654 | A1 | 8/2001 | Kimura |
| 5,977,613 | A | 11/1999 | Takata et al. | 2001/0014538 | A1 | 8/2001 | Kwan et al. |
| 5,977,615 | A | 11/1999 | Yamaguchi et al. | 2002/0024122 | A1 | 2/2002 | Jung et al. |
| 5,977,630 | A | 11/1999 | Woodworth et al. | 2002/0027297 | A1 | 3/2002 | Ikenaga et al. |
| 5,981,314 | A | 11/1999 | Glenn et al. | 2002/0140061 | A1 | 10/2002 | Lee |
| 5,986,333 | A | 11/1999 | Nakamura | 2002/0140068 | A1 | 10/2002 | Lee et al. |
| 5,986,885 | A | 11/1999 | Wyland | 2002/0163015 | A1 | 11/2002 | Lee et al. |
| 6,001,671 | A | 12/1999 | Fjelstad | 2003/0030131 | A1 | 2/2003 | Lee et al. |
| 6,013,947 | A | 1/2000 | Lim | 2003/0073265 | A1 | 4/2003 | Hu et al. |
| 6,018,189 | A | 1/2000 | Mizuno | 2004/0056277 | A1 | 3/2004 | Karnezos |
| 6,020,625 | A | 2/2000 | Qin et al. | 2004/0061212 | A1 | 4/2004 | Karnezos |
| 6,025,640 | A | 2/2000 | Yagi et al. | 2004/0061213 | A1 | 4/2004 | Karnezos |
| 6,031,279 | A | 2/2000 | Lenz | 2004/0063242 | A1 | 4/2004 | Karnezos |
| RE36,613 | E | 3/2000 | Ball | 2004/0063246 | A1 | 4/2004 | Karnezos |
| 6,034,423 | A | 3/2000 | Mostafazadeh et al. | 2004/0065963 | A1 | 4/2004 | Karnezos |
| 6,040,626 | A | 3/2000 | Cheah et al. | | | | |
| 6,043,430 | A | 3/2000 | Chun | | | | |

FOREIGN PATENT DOCUMENTS

| | | |
|---|---|---|
| EP | 5950939 | 3/1984 |
| EP | 0393997 | 10/1990 |
| EP | 0459493 | 12/1991 |
| EP | 0720225 | 3/1996 |
| EP | 0720234 | 3/1996 |
| JP | 55163868 | 12/1980 |
| JP | 5745959 | 3/1982 |
| JP | 58160095 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 4098864 | 9/1992 |
| JP | 5129473 | 5/1993 |
| JP | 5166992 | 7/1993 |
| JP | 5283460 | 10/1993 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 864634 | 3/1996 |
| JP | 8083877 | 3/1996 |
| JP | 8125066 | 5/1996 |
| JP | 8222682 | 8/1996 |

| | | | |
|---|---|---|---|
| 6,060,768 | A | 5/2000 | Hayashida et al. |
| 6,060,769 | A | 5/2000 | Wark |
| 6,072,228 | A | 6/2000 | Hinkle et al. |
| 6,075,284 | A | 6/2000 | Choi et al. |
| 6,081,029 | A | 6/2000 | Yamaguchi |
| 6,084,310 | A | 7/2000 | Mizuno et al. |
| 6,087,715 | A | 7/2000 | Sawada et al. |
| 6,087,722 | A | 7/2000 | Lee et al. |
| 6,100,594 | A | 8/2000 | Fukui et al. |
| 6,113,474 | A | 9/2000 | Constantini et al. |
| 6,114,752 | A | 9/2000 | Huang et al. |
| 6,118,174 | A | 9/2000 | Kim |
| 6,118,184 | A | 9/2000 | Ishio et al. |
| RE36,907 | E | 10/2000 | Templeton, Jr. et al. |
| 6,130,115 | A | 10/2000 | Okumura et al. |
| 6,130,473 | A | 10/2000 | Mostafazadeh et al. |
| 6,133,623 | A | 10/2000 | Otsuki et al. |
| 6,140,154 | A | 10/2000 | Hinkle et al. |
| 6,281,568 | B1 * | 8/2001 | Glenn et al. ............... 257/684 |
| 6,348,726 | B1 | 2/2002 | Bayan et al. |
| 6,355,502 | B1 | 3/2002 | Kang et al. |
| 6,369,447 | B1 | 4/2002 | Mori |
| 6,369,454 | B1 | 4/2002 | Chung |
| 6,373,127 | B1 | 4/2002 | Baudouin et al. |
| 6,380,048 | B1 | 4/2002 | Boon et al. |
| 6,384,472 | B1 | 5/2002 | Huang |
| 6,388,336 | B1 | 5/2002 | Venkateshwaran et al. |
| 6,395,578 | B1 | 5/2002 | Shin et al. |
| 6,400,004 | B1 | 6/2002 | Fan et al. |
| 6,410,979 | B1 | 6/2002 | Abe |
| 6,414,385 | B1 | 7/2002 | Huang et al. |
| 6,420,779 | B1 | 7/2002 | Sharma et al. |
| 6,429,508 | B1 | 8/2002 | Gang |
| 6,437,429 | B1 | 8/2002 | Su et al. |
| 6,444,499 | B1 | 9/2002 | Swiss et al. |
| 6,448,633 | B1 | 9/2002 | Yee et al. |
| 6,452,279 | B1 | 9/2002 | Shimoda |
| 6,459,148 | B1 | 10/2002 | Chun-Jen et al. |
| 6,464,121 | B1 | 10/2002 | Reijnders |
| 6,476,469 | B1 | 11/2002 | Huang et al. |
| 6,476,474 | B1 | 11/2002 | Hung |
| 6,482,680 | B1 | 11/2002 | Khor et al. |
| 6,498,099 | B1 | 12/2002 | McLellan et al. |
| 6,498,392 | B1 | 12/2002 | Azuma |
| 6,507,096 | B1 | 1/2003 | Gang |
| 6,507,120 | B1 | 1/2003 | Lo et al. |
| 6,534,849 | B1 | 3/2003 | Gang |
| 6,545,332 | B1 | 4/2003 | Huang |
| 6,545,345 | B1 | 4/2003 | Glenn et al. |

| | | | | | | |
|---|---|---|---|---|---|---|
| JP | 8306853 | 11/1996 | | JP | 992775 | 4/1997 |
| JP | 98205 | 1/1997 | | KR | 941979 | 1/1994 |
| JP | 98206 | 1/1997 | | | | |
| JP | 98207 | 1/1997 | | * cited by examiner | | |

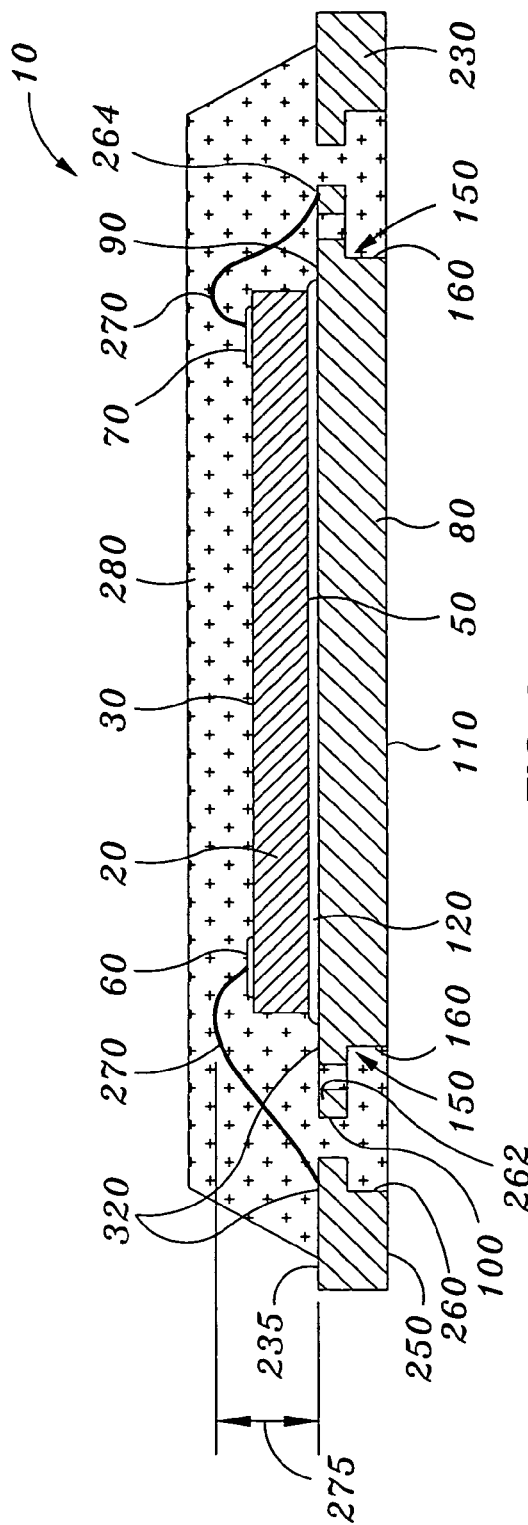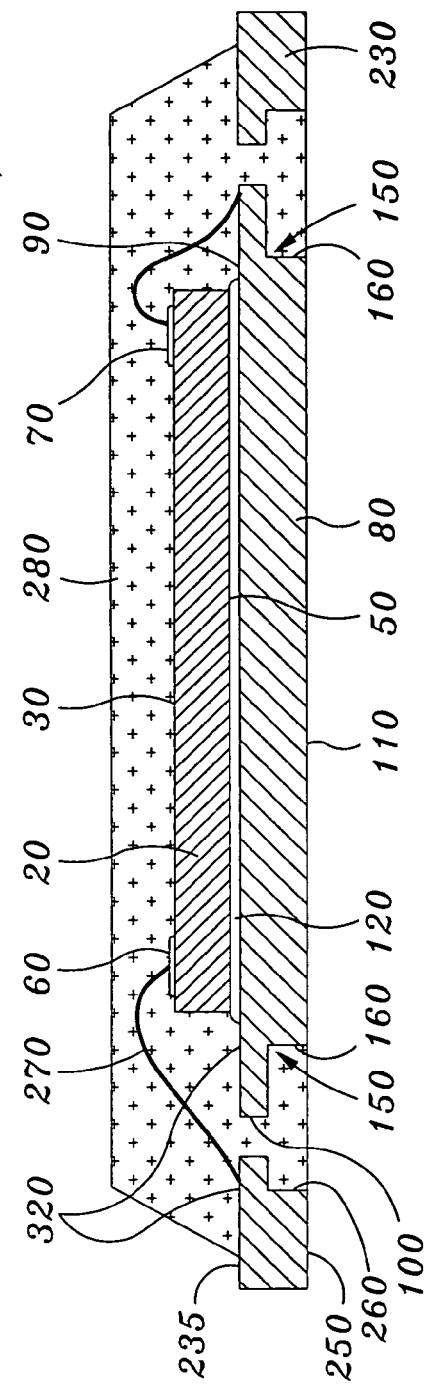

SEMICONDUCTOR PACKAGE HAVING IMPROVED ADHESIVENESS AND GROUND BONDING

CROSS-REFERENCE TO RELATED APPLICATIONS

The present application is a continuation of U.S. patent application Ser. No. 09/687,493 entitled SEMICONDUCTOR PACKAGE HAVING IMPROVED ADHESIVENESS AND GROUND BONDING filed Oct. 13, 2000 and issued as U.S. Pat. No. 6,853,059 on Feb. 8, 2005.

BACKGROUND OF THE INVENTION

1. Technical Field of the Invention

The various embodiments of the present invention relates in general to a semiconductor package and, more particularly but not by way of limitation, to a semiconductor package in which the adhesiveness between a chip paddle and a package body is improved, and the chip paddle ground-bonding is improved.

2. History of Related Art

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal leadframes for supporting an integrated circuit chip which is bonded to a chip paddle region formed centrally therein. Bond wires which electrically connect pads on the integrated circuit chip to individual leads of the leadframe are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a leadframe as the central supporting structure of such a package. A portion of the leadframe completely surrounded by the plastic encapsulant is internal to the package. Portions of the leadframe extend internally from the package and are then used to connect the package externally. More information relative to leadframe technology may be found in Chapter 8 of the book *Micro Electronics Packaging Handbook*, (1989), edited by R. Tummala and E. Rymaszewski and incorporated by reference herein. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically includes a motherboard on which a significant number of such semiconductor packages are secured to provide multiple electronic functions. Not only are semiconductor chips highly integrated, but also semiconductor packages are highly miniaturized with an increased level of package mounting density.

According to such miniaturization tendencies, semiconductor packages, which transmit electrical signals from semiconductor chips to motherboards and support the semiconductor chips on the motherboards, have been designed to have a small size. By way of example only, such semiconductor packages may have a size on the order of 1×1 mm to 10×10 mm. Examples of such semiconductor packages are referred to as MLF (micro leadframe) type semiconductor packages and MLP (micro leadframe package) type semiconductor packages. Both MLF type semiconductor packages and MLP type semiconductor packages are generally manufactured in the same manner.

However, this conventional semiconductor package is problematic in that a thickness of the silver plated layer formed on the upper faces of the chip paddle and the internal leads deteriorates the adhesiveness between the package body and the chip paddle or the internal leads. That is, the silver-plated layer is very weakly bonded to the package body of the encapsulation material (the chip paddle or the side of the internal lead, both of which are made of copper, are strongly bonded to the package body), so that interfacial exfoliation is easily caused at the boundary between the package body and the silver-plated layer. Further, moisture can readily permeate the semiconductor package through the exfoliated portion, which may cause the semiconductor package to crack.

Usually a semiconductor chip or a chip paddle is ground-bonded by conductive wires to achieve grounding or eliminate electrical noise problems. In this conventional semiconductor package, the semiconductor chip is similar in area to the chip paddle, so that there are no sufficient areas for ground bonding.

BRIEF SUMMARY OF THE INVENTION

In one embodiment of the present invention, there is provided a semiconductor chip having an upper surface and a bottom surface. A plurality of input bond pads and output bond pads on the upper surface of the semiconductor chip and along the perimeter of the semiconductor chip are electrically connected to the semiconductor chip. A chip paddle is provided which has a top surface, a side surface and a bottom surface. The chip paddle is bonded to the bottom surface of the semiconductor chip by an adhesive. The chip paddle has corners, a perimeter and a half-etched section at the lower edge of the chip paddle along the chip paddle perimeter.

A leadframe is provided having a plurality of tie bars. Each of the tie bars has a side surface and a bottom surface. Each of the tie bars is connected to the corners of the chip paddle and externally extends from the chip paddle and has a half-etched section. A plurality of dam bars is provided on the leadframe to help limit flow of encapsulation material on the leadframe.

A plurality of internal leads connects to the leadframe. Each of the leads has a side surface and a bottom surface. The leads are radially formed at regular intervals along and spaced apart from the perimeter to the chip paddle and extend towards the chip paddle. Each of the leads has a step shaped half-etched section facing the chip paddle.

A ground ring is provided having an upper surface and a lower surface, and positioned between the semiconductor chip and the plurality of internal leads. The ground ring may interchangeably be used as a ground or a power ring. The upper surface of the ground ring is substantially planar with the upper surface of the semiconductor chip and the upper surface of the plurality of internal leads. A plurality of conductive wires is electrically connected to the plurality of internal leads and the semiconductor chip, wherein the conductive wires have a loop height between the leads and the semiconductor chip. Because of the planarity of the grounding leads and semiconductor chip, the loop height of the conductive wires is minimized, which allows smaller packaging.

Encapsulating material encapsulates the semiconductor chip, conductive wires, chip paddle, and the leads to form a package body. The flow of the encapsulation material is limited by the dam bars formed on the leadframe. After encapsulation, the chip paddle, leads, and tie bars are externally exposed at respective side and bottom surfaces. The chip paddle further has through-holes in the half-etched section of the chip paddle for increasing the bonding strength of the encapsulation material in the package body. In addition, tabs in the half-etched section of the chip paddle may be provided for the same purpose.

BRIEF DESCRIPTION OF THE DRAWINGS

A more complete understanding of the method and apparatus of the present invention may be obtained by reference to the following detailed description with like reference numerals referring to like elements when taken in conjunction with the accompanying Drawings wherein:

FIG. 2 is a side elevation cross-section view of the semiconductor package of FIG. 1 taken along line 2—2;

FIG. 3 is a side elevation cross-section view of the semiconductor package of FIG. 1 taken along line 3—3;

DETAILED DESCRIPTION OF THE INVENTION

Figure 1:
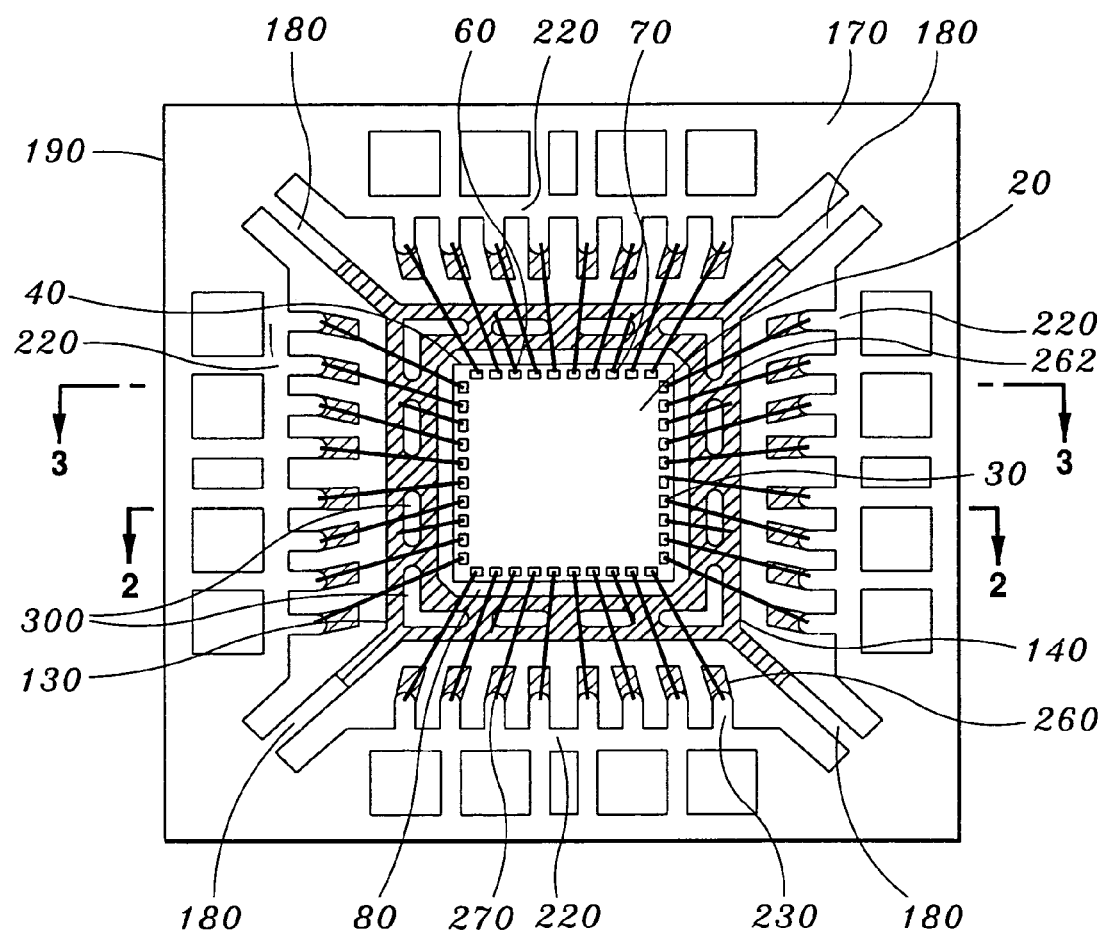
FIG. 1 is a top plan view of one embodiment of the semiconductor package of the present invention.

Referring first to FIGS. 1 through 3, a semiconductor package 10 is shown construed in accordance with the principals of the present invention. The semiconductor package 10 includes a semiconductor chip 20 having an upper surface 30, a perimeter 40 and a bottom surface 50. A plurality of input bond pads 60 and output bond pads 70 is disposed on the upper surface 30 of the semiconductor chip 20. A chip paddle 80 having a top surface 90, a side surface 100 and a bottom surface 110 is secured to the bottom surface 50 of the semiconductor chip 20 via an adhesive 120. The chip paddle 80 has corners 130, a perimeter 140 and a half-etched section 150. The half-etched section 150 is located at a lower edge 160 of the chip paddle 80.

Referring now to FIGS. 1 through 3 in combination, a leadframe 170 is shown having a plurality of tie bars 180, a side surface 190 and a bottom surface (not shown). The tie bars 180 are connected to the corners 130 of the chip paddle 80. The tie bars 180 externally extend from the chip paddle 80. The leadframe 170 further has a plurality of dam bars 220.

A plurality of leads 230 are connected to the leadframe 170 and have an upper surface 235 and a bottom surface 250. The leads 230 are radially formed at regular intervals along the perimeter 140 and spaced apart from the perimeter 140 of the chip paddle 80. The leads 230 extend towards the chip paddle 80, such that each of the plurality of leads 230 has a half-etched section 260 facing the chip paddle 80. It is to be noted that the hatched areas in FIG. 1 are the half-etched sections of the paddle 80 and leads 230.

Referring to FIG. 2, there is disclosed a ground ring 262 formed in the half-etched section 150 of the chip paddle 80. The ground ring 262 is positioned between the semiconductor chip 20 and the plurality of leads 230. The ground ring 262 may be interchangeably used as a power ring should circumstances require. The upper surface 264 of the ground ring 262 is planar with the upper surface 90 of the chip paddle 80 and the upper surface 235 of the leads 230.

A plurality of conductor wires 270 is provided and electrically connected to the plurality of leads 230 and the semiconductor chip 20. The plurality of conductive wires 270 have a loop height 275 between the plurality of leads 230 and the semiconductor chip 20. The loop height 275 of the conductive wires 270 is minimized from the upper surface 235 of the leads 230 and the upper surface 30 of the semiconductor chip 20.

To form the semiconductor package 10, encapsulation material 280 encapsulates the semiconductor chip 20, conductive wires 270, chip paddle 80, and leads 230. The dam bars 220 limit the flow of the encapsulation material 280 on the leadframe 170. During encapsulation, the chip paddle 80, leads 230, and tie bars 180 are externally exposed at the respective side and bottom surfaces. In one embodiment, the chip paddle 80 is provided with a plurality of through holes 300 in the half-etched section 150 for increasing the bonding strength of the encapsulation material 280 with the package 10.

The through holes 300 (FIG. 1) may be formed by chemical etching, such as when patterning the entire leadframe 170 for forming the half-etched section 150 of the chip paddle 80. Alternatively, the through holes 300 (FIG. 1) may be formed by the use of a mechanical punch or similar device. It should be noted that other methods may be used to form the through holes 300, and the various embodiments of the present invention are not limited by the formation techniques disclosed herein.

Figure 4:
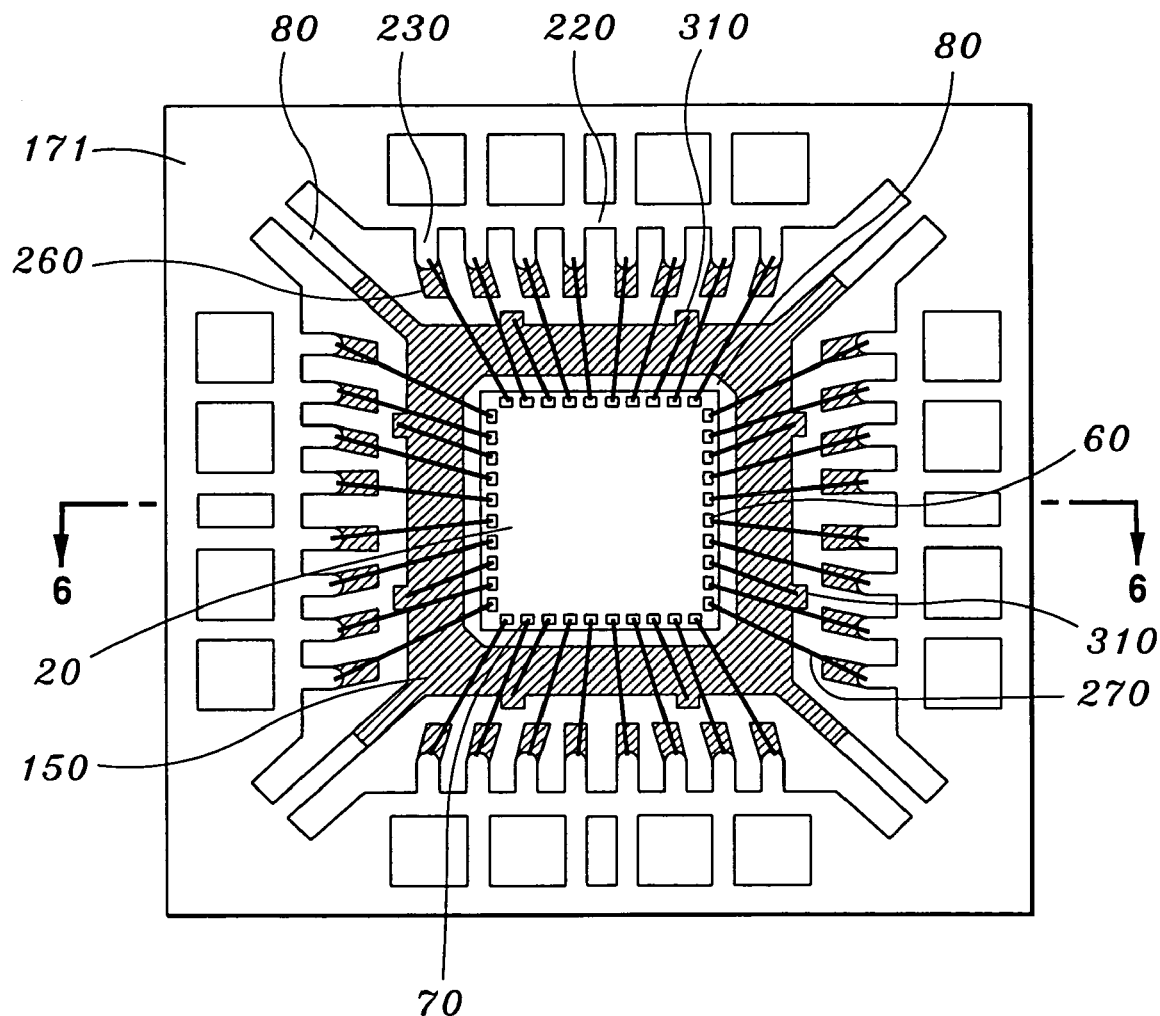
FIG. 4 is a top plan view of an alternate embodiment for the semiconductor package of the present invention.
Figure 5:
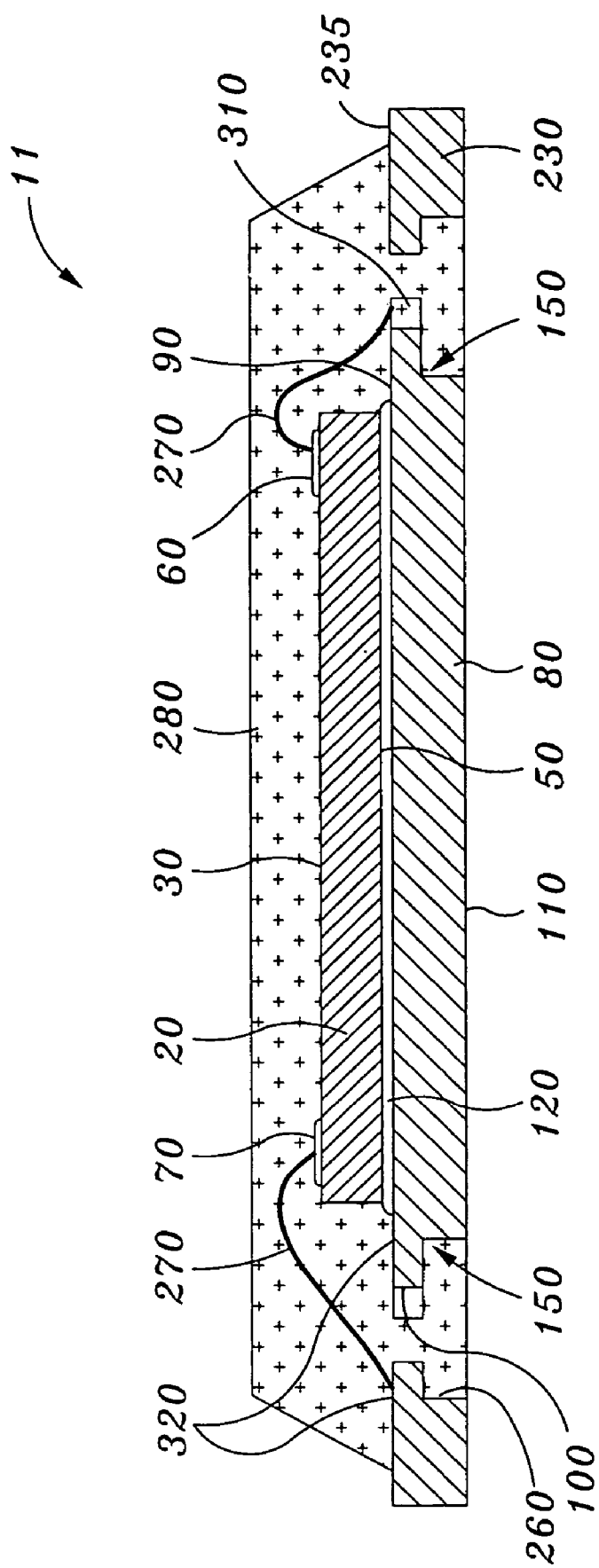
FIG. 5 is a side elevation cross-section view of the semiconductor package of FIG. 4 taken along line 6—6.

Referring now to FIG. 4 and FIG. 5, an alternate embodiment for a semiconductor package 11 is shown. In this embodiment, the chip paddle 80 is provided with a plurality of tabs 310 in the half-etched section 150 of the chip paddle 80 for the similar purpose of increased bonding strength. It is also contemplated that the combination of through holes 300 (FIG. 1) and tabs 310 may be used to increase the bonding strength of the encapsulation material 280 in the package 10.

The tabs 310 are formed in the half-etched section 150 of the chip paddle 80. The tabs 310 must extend to a limited degree to prevent a short circuit forming between the tabs 310 and the leads 230. It is preferable that the number of the tabs 310 corresponds to the number of the grounding input bond pads 60 and output bond pads 70 of the semiconductor chip 20. The tabs 310 may be formed by chemical etching when patterning the entire leadframe 171 and also by other mechanical methods depending on the requirements of the individual package 11. By increasing the area or length of the chip paddle 80, the tabs 310 are easily bonded with conductive wires 270 by increasing the area for which to connect the conductive wires 270. The tabs 310 may serve to function as a ground or power ring in certain applications. It is to be noted that the hatched areas in FIG. 4 are the half-etched sections of the paddle 80 and leads 230.

The tab 310 is electrically connected to the semiconductor chip 20 via conductive wire 270.

As described previously, the use of the through holes 300 and tabs 310 increases the bonding strength to the encapsulation material 280, in addition to improving the fluidity of the encapsulation material 280 upon encapsulating. The presence of the through holes 300 and tabs 310 improves the fluidity of encapsulation material 280 by directing flow over or through the tabs 310 and through holes 300 in the package 10. In certain embodiments, as shown in FIGS. 2 and 3, a plated layer 320 may be applied to the upper surfaces 90, 235 of the chip paddle 80 and leads 230, respectively, to increase bonding strength to the wires 270.

It is thus believed that the operation and construction of the present invention will be apparent from the foregoing description of the preferred exemplary embodiments. While the semiconductor package having improved adhesiveness and crown bonding shown as described is preferred, it will be obvious to a person of ordinary skill in the art that various changes and modifications may be made therein without departing from the spirt and scope of the invention.

The previous description is of a preferred embodiment for implementing the invention, and the scope of the invention should not necessarily be limited by this description. The scope of the present invention is instead defined by the following claims.

The following applications are all being filed on the same date as the present application and all are incorporated by reference as if wholly rewritten entirely herein, including any additional matter incorporated by reference therein:

| U.S. Pat. No. | Title of Application | First Named Inventor |
|---|---|---|
| 6,501,161 | Semiconductor Package Having Increased Solder Joint Strength | Kil Chin Lee |
| 6,667,662 | Clamp and Heat Block Assembly for Wire Bonding a Semiconductor Package Assembly | Young Suk Chung |
| 6,639,308 | Near Chip Size Semiconductor Package | Sean Timothy Crowley |
| 6,753,597 | Semiconductor Package | Sean Timothy Crowley |
| 6,605,866 | Stackable Semiconductor Package and Method for Manufacturing Same | Sean Timothy Crowley |
| 6,730,544 | Stackable Semiconductor Package and Method for Manufacturing Same | Jun Young Yang |
| 6,616,436 | Method of and Apparatus for Manufacturing Semiconductor Packages | Hyung Ju Lee |
| 6,555,899 | Semiconductor Package Leadframe Assembly and Method of Manufacture | Young Suk Chung |

It is thus believed that the operation and construction of the present invention will be apparent from the foregoing description of the preferred exemplary embodiments. It will be obvious to a person of ordinary skill in the art that various changes and modifications may be made herein without departing from the spirit and scope of the invention.

What is claimed is:

1. A semiconductor package, comprising:
    a chip paddle having opposed top and bottom paddle surfaces;
    a ground ring defined by a peripheral portion of the chip paddle, the ground ring defining opposed top and bottom ring surfaces;
    a semiconductor chip attached to the top surface of the chip paddle;
    a plurality of leads having opposed top and bottom lead surfaces and extending at least partially about the chip paddle in spaced relation thereto, the ground ring being positioned between the semiconductor chip and the leads, with the semiconductor chip being electrically connected to at least one of the leads; and
    an encapsulation material covering the chip paddle, the ground ring, the semiconductor chip and the leads such that at least portions of the bottom lead surfaces of the leads are exposed therein.

2. The semiconductor package of claim 1 wherein the ground ring is partially defined by a plurality of through holes disposed within the chip paddle in spaced relation to earth other.

3. The semiconductor package of claim 2 wherein each of the through holes has an elongate, slot-like configuration.

4. The semiconductor package of claim 1 wherein the chip paddle includes a peripheral half-etched section which circumvents and is recessed relative to the bottom paddle surface, the ground ring being included in the half etched section of the chip paddle.

5. The semiconductor package of claim 4 wherein the ground ring is partially defined by a plurality of trough holes disposed within the half-etched section of the chip paddle.

6. The semiconductor package of claim 1 wherein the top ring surface and the top paddle surface extend in generally co-planar relation to each other.

7. The semiconductor package of claim 6 wherein the top ring surface and the top lead surfaces of the leads extend in generally co-planar relation to each other.

8. The semiconductor package of claim 1 wherein the bottom paddle surface of the chip paddle is exposed in the encapsulation material.

9. The semiconductor package of claim 8 wherein the bottom paddle surface of the chip paddle and the bottom lead surfaces of the leads extend in generally co-planar relation to each other.

10. The semiconductor package of claim 1 wherein the semiconductor chip is electrically connected to the ground ring.

11. The semiconductor package of claim 10 wherein the electrical connection of the semiconductor chip to the ground ring and to at least one of the leads is facilitated by conductive wires which are covered by the encapsulation material.

* * * * *